United States Patent [19]

Gray et al.

[11] Patent Number: 4,883,767

[45] Date of Patent: Nov. 28, 1989

[54] METHOD OF FABRICATING SELF ALIGNED SEMICONDUCTOR DEVICES

[75] Inventors: Peter V. Gray, Scotia; Bantval J. Baliga, Schenectady, both of N.Y.; Mike F. S. Chang, Cary, N.C.; George C. Pifer, North Syracuse, N.Y.

[73] Assignee: General Electric Company, Schenectady, N.Y.

[21] Appl. No.: 220,353

[22] Filed: Jul. 14, 1988

Related U.S. Application Data

[63] Continuation of Ser. No. 938,693, Dec. 5, 1986, abandoned.

[51] Int. Cl.[4] .................................. H01L 21/265
[52] U.S. Cl. ...................................... 437/41; 437/31; 437/984; 437/228; 357/23.4
[58] Field of Search ............... 357/23.4; 437/150, 41, 437/984, 228, 225, 31, 160; 156/653, 657, 643

[56] References Cited

U.S. PATENT DOCUMENTS

| | | | |
|---|---|---|---|
| 3,635,772 | 1/1972 | Pestie et al. | 437/150 |
| 3,761,328 | 9/1973 | Abe et al. | 437/150 |
| 3,852,127 | 12/1974 | Lamming | 437/150 |
| 4,072,975 | 2/1978 | Ishitani | 437/150 |
| 4,417,385 | 11/1983 | Temple | 357/23.4 |
| 4,443,931 | 4/1984 | Baliga et al. | |
| 4,466,176 | 8/1984 | Temple | 357/23.4 |
| 4,468,852 | 9/1984 | Cerafalini | 156/657 |
| 4,583,106 | 4/1986 | Anantha et al. | 357/59 H |
| 4,593,302 | 6/1986 | Lidow et al. | 357/23.4 |
| 4,646,117 | 2/1987 | Temple | 357/23.4 |
| 4,651,181 | 3/1987 | David | 357/23.4 |

FOREIGN PATENT DOCUMENTS

| | | | |
|---|---|---|---|
| 0023277 | 2/1977 | Japan | 357/23.4 |
| 0078574 | 6/1980 | Japan | 357/23.4 |
| 0088772 | 6/1982 | Japan | 357/23.4 |
| 0021066 | 2/1984 | Japan | 357/23.4 |
| 0231860 | 12/1984 | Japan | 357/23.4 |
| 8202981 | 9/1982 | PCT Int'l Appl. | 357/23.4 |

OTHER PUBLICATIONS

T. P. Chow et al., "A Self-Aligned Short Process for Insulated Gate Transistors", IEDM, International Electron Devices Meeting, Washington, DC, Dec. 104, 1985, pp. 146–149.

Primary Examiner—Brian E. Hearn
Assistant Examiner—Kevin McAndrews
Attorney, Agent, or Firm—Robert Ochis; James C. Davis, Jr.; Marvin Snyder

[57] ABSTRACT

A self aligned method of fabricating a self aligned semiconductor device employs an initial step in which a first window having an inner perimeter and outer perimeter is opened through a first protective layer situated atop a semiconductor substrate, to divide the substrate into three separate zones. The window exposes a first surface portion of the semiconductor substrate and circumferentially defines or encompasses a second central portion of the protective layer as well as a second unexposed surface portion of the substrate. A third surface portion of the substrate lies beyond the outer perimeter of the first window. Precisely aligned substrate regions of the same or different conductivity type can be established by using differentially etchable materials to mask designated surface portions of the substrate.

61 Claims, 7 Drawing Sheets

METHOD OF FABRICATING SELF ALIGNED SEMICONDUCTOR DEVICES

This application is a continuation of application Ser. No. 938,693, filed Dec. 5, 1986, now abandoned.

BACKGROUND OF THE INVENTION

It is recognized that an effective method of fabricating semiconductor devices involves performing two or more successive dopings into a semiconductor layer to thereby, for instance, establish a region of one type conductivity within a second region of an opposite type conductivity which is itself situated in a layer of one type conductivity. It is desirable to align the various regions in a desired relationship to allow the fabricated device to function properly. Practically, it is difficult to precisely align two regions with available semiconductor techniques and thus the fabricated device may not operate as well as it might. An example of one such device involves an insulated gate transistor in which a first region of opposite type conductivity is disposed with a second region of one type conductivity disposed within a layer of opposite type conductivity. An insulated gate electrode is disposed on the layer coextensive with a portion of the second region to provide for conduction of one type conductivity carriers between the layer and the first region.

These insulated gate transistors, however, are susceptible to operation in a non-preferred mode whereby a parasitic bipolar transistor disposed within the device may turn on in an undesired fashion, if for instance, the short between the source and base is not adequate or if the sheet resistance of the base is too low. It has been proposed to improve the sheet resistance of the base of the device by using a second deep P+ diffusion in a parasitic NPN structure to reduce the sheet resistance of the P base layer and at the same time provide good contact between a source electrode and the lightly doped P base region. This deep P+ diffusion, in combination with the lightly doped shallow base diffusion, determines the channel properties of the device.

It has been a limitation of prior insulated gate transistors that the deep P+ diffusions could not be easily fabricated because careful alignment of the source region with the base region is required to advantageously employ a deep P+ base within a device and to provide a device exhibiting a current density which is commercially acceptable. Inasmuch as a single mask has heretofore been employed to define only two separate regions, it has not been possible to precisely align two separate regions. Misalignments occur and the devices must be configured to accommodate the misalignments. Specifically, misalignment of the source region with the base region within an insulated gate transistor establishes a longer current path along the junction between the source and base regions and hence increases the voltage drop along that junction contributing to a potential breakdown across that junction. If a breakdown does occur across that junction, the parasitic transistor turns on and gate control of the device is lost. It is therefore desirable to minimize the length of the junction and the size of the device regions to avoid this undesired potential breakdown by precisely aligning the regions of the device.

OBJECTS OF THE INVENTION

A principal object of the present invention is to provide a new and improved method for fabricating a semiconductor device.

Another object of the present invention is to provide a method of fabricating a semiconductor device in which two or more device regions are established in precise and aligned relation to each other.

In addition, the present invention provides for the establishment of an insulated gate device in which two or more device regions are self aligned.

It is a further object of the present invention to provide an improved method of fabricating an insulated gate semiconductor device exhibiting an improved resistance to undesired latch-up.

It is a further object of the present invention to provide a method of fabricating a semiconductor device in which a single photolithographic masking divides the device protective layer into three separate regions which are precisely aligned with each other and which can be processed differently to establish three precisely aligned regions. The present invention thus eliminates the need for establishing a precise registry between photolithographic masks applied successively on the surface of the device substrate.

A still further object of the present invention is to provide a method for fabricating an improved insulated gate semiconductor device in which a window is opened through a first portion of a first protective layer to expose a first portion of a semiconductor substrate and to define a second central portion of the protective layer and an unexposed portion of the semiconductor substrate therebeneath. A third outer and unexposed portion of the first protective layer is also defined to surround the first and second portions.

SUMMARY OF THE INVENTION

These and other objects and features of a preferred embodiment of a method of fabricating a self aligned insulated gate semiconductor device in accordance with the present invention are achieved by providing a semiconductor substrate and establishing a first protective layer atop the substrate. A first window is opened through a first portion of the first protective layer to expose a first portion of the surface of the substrate. The first window circumferentially defines or encompasses a second portion of the first protective layer and a second unexposed portion of the surface of the substrate therebeneath. A third portion of the first protective layer surrounds the first and second portions of the first protective layer. One or more regions can be formed in a precisely aligned relation through the first window within the first portion of the substrate. The third portion of the first protective layer is coated with an etch resistant material and a second window is opened through the second portion of the first protective layer. One or more regions can be established in the second portion of the substrate in precisely aligned relationship with each other and the regions established through the first window.

Additional objects and features of the present invention are achieved in a preferred method of fabricating a self aligned semiconductor device, such as an insulated gate semiconductor device, by providing a semiconductor substrate, such as a silicon substrate exhibiting approximately 5 ohms/cm resistivity. The substrate is then covered with a first protective layer, which can, for instance, be deposited on the oxide layer. In an alternate preferred embodiment, the step of establishing a first protective layer comprises the steps of establishing a first insulating layer such as a native oxide, depositing thereon a layer of gate electrode material, such as a polysilicon layer, encasing the gate layer in a second insulating layer, such as a second oxide layer, and depositing a nitride layer atop the second insulating layer. A first window is opened through the first protective layer with, for instance, a reactive ion etch to expose a first portion of the substrate. The first window circumferentially defines a second central portion of the substrate thereunder. A first doping is made into the substrate through the first window to establish a first region by, for instance, diffusion or implantation doping. A second protective layer is formed in the first window on the exposed portion of the substrate by, for instance, growing a native oxide in the first window. It is important that the first protective layer be removable by an etching technique which does not remove the second protective layer. Generally, this criteria mandates that the first and second protective layers be different materials, such as nitride and oxide materials. A second window is photolithographically opened through the second portion of the first protective layer to thereby expose the second central unexposed portion of the substrate by, for instance, etching with an etch specific to the materials contained in the second portion of the first protective layer overlying the second portion of the substrate, but ineffective against the protective materials forming the second protective layer. A second doping is made into the substrate through the second window by, for instance, implantation or diffusion doping to establish a second region. Thus, the first and second regions are established in a prespecified or aligned relationship which, in a preferred embodiment, is a symmetrical relationship.

As will be discussed below in more detail, a first photolithographic masking is used to establish the boundaries for the first and second windows and thus divides the first protective layer and the substrate into three separate zones: an inner zone of the second window, a middle zone of the first window and an outer zone outside and surrounding the first window. By establishing a first window through a first portion of the protective layer and which circumferentially defines an unexposed second portion of the substrate, first and second regions of the same or different type conductivity can be established within the substrate by masking the first region with a second protective material which is resistant to the etch used to cut through or remove the protective material overlying the second portion of the first protective layer.

This method can be further enhanced by, for instance, forming a third protective layer in the second window, removing the second protective layer, and making a third doping into said substrate to establish an aligned third region. Alternatively, the second protective layer can be removed and a third doping can be performed over the first and second regions. In a preferred embodiment, the first region can be established by a heavy concentration of slow diffusing opposite type conductivity material into an opposite type conductivity substrate, while the second doping can be established with a fast diffusing one type conductivity material and the third doping can be established by lightly doping with a fast diffusing one type material. A metallization layer can be applied on the surface of the substrate overlying, and in ohmic contact with, a portion of the first and second regions to establish an electric short therebetween. In a preferred embodiment, the third window is coextensive with the first window and in a further preferred embodiment, the third window is coextensive with both the first and second windows.

In an alternate preferred embodiment, a self aligned semiconductor device such as an insulated gate semiconductor device can be fabricated by providing a substrate such as a silicon substrate having a resistivity of approximately 5 ohms/cm, and coating the substrate with a first protective layer which can comprise an oxide layer, a gate electrode is disposed atop the first oxide layer, and a second oxide layer is disposed atop the gate electrode. The second oxide layer in combination with the first oxide layer encloses the gate electrode. A passivating layer, such as a nitride layer, can be disposed atop the second insulating layer. A first window is opened through a first portion of the first protective layer to expose a first portion surface of the substrate, circumscribe or encompass a second portion of the first protective layer and define an unexposed portion of the substrate therebeneath. The first window can, for instance, be opened by using photolithographic masking techniques to define an area of interest and thereafter applying appropriate etches to remove the nitride, metal and oxide materials, if any, comprising the first protective layer. Subsequently, and before the first region is doped, a second protective layer such as oxide, is disposed within the first window and can, for instance, comprise silicon dioxide. The material of the first protective layer outside the first window can be coated with an etch resistant material, such as photoresist, and a material specific etch then can be used to remove the circumferentially defined second portion of the first protective layer without removing the second protective layer, to thereby expose a previously unexposed second portion of the substrate. A first doping is made through the second window to establish a first region by, for instance, diffusion or implantation techniques with a heavy concentration of fast diffusing one type conductivity material. A third protective coating, such as a nitride material, is disposed in the second window and subsequently a third window is opened through the region of the first window to expose a third portion of the substrate. The third window can be established by using an etch specific to the material of the second protective layer. A second doping is made through the third window to establish a second region by, for instance, employing a light concentration of a fast diffusing one type conductivity material in combination with diffusion or implantation techniques. Subsequently, a third doping is made through the third window to establish a third region by, for instance, employing a heavy concentration of a slow diffusing opposite type conductivity material in combination with conventional diffusion or implantation techniques. Subsequently, a fourth protective layer such as an oxide layer, can be established in the third window and a fourth window can be established in the region of the second window by, for instance, etching the previously established third protective layer to thereby expose portions of the first, second and third regions. A metallization layer can be applied through the fourth window to the first and second regions to establish a short between the first and second regions. The area of the fourth window is preferably coextensive with the area of the second window and the area of the third window is coextensive with the area of the second window.

An alternate preferred embodiment of a self aligned semiconductor device, such as an insulated gate semiconductor device of the present invention, can be fabricated by providing a semiconductor substrate of, for instance, a silicon material having a resistivity of 5 ohms/cm. A first protective layer is disposed thereon. The first protective layer preferably comprises a first insulating layer, such as an oxide layer, a gate electrode disposed atop the first insulating layer and a second insulating layer, such as an oxide layer, enveloping the gate electrode and engaging the first insulating layer. A passivation nitride layer can be also disposed atop the second insulating layer. Subsequently, a first window is opened through a first portion of the first protective layer by conventional photolithographic masking and etching techniques to expose a first portion of the substrate and circumferentially define a second portion of the first protective layer and a second central unexposed portion of the substrate therebeneath. The first window is preferably opened by successively employing different etches to remove the previously deposited material which may, for instance, comprise oxides, nitrides and polysilicons. A first doping is made through the first window to establish a first region and can be established by employing a light concentration of a slow diffusing one type conductivity material to produce a first lightly doped region of one type conductivity. Subsequently, a second protective layer is disposed in the first window and can, for instance, comprise a native oxide. The material of the first protective layer outside the first window can be coated with an etch resistant material, such as a photoresist. Initially, undeveloped photoresist is applied to the entire upper surface. A loose fitting mask is positioned to cover all of the second portion of the first protective layer and a portion of the second protective layer. The photoresist is exposed to light through the mask and the photoresist is developed with the masked portion being removed and unmasked portion remaining in place.

A second window is opened through the second portion of the first protective layer to thereby expose the unexposed central portion of the substrate and a second doping of the substrate is performed through the second window with a heavy concentration of a fast diffusing one type conductivity material to establish a second region of the one type conductivity. Thereafter, a third protective layer, such as a native oxide, can be disposed within the second window. The previously deposited photoresist layer can be removed and a third window through the second protective layer can be opened by, for instance, photolithographic masking and etching techniques to expose a portion of the first region. Subsequently, the first region can be successively doped with a heavy concentration of slow diffusing opposite conductivity material to establish an opposite conductivity third region. The third window is preferably coextensive with the first window.

In a still further alternate preferred embodiment the self aligned insulated gate semiconductor device of the present invention can be fabricated by providing a semiconductor substrate of, for instance, a silicon material having a resistivity of 5 ohms/cm. The first protective layer preferably comprises a first insulating layer, such as a native oxide, a gate electrode disposed atop the insulating layer and a second insulating layer, such as a native oxide, enveloping the gate electrode and engaging the first insulating layer. A passivation nitride layer can be disposed atop the second insulating layer. Subsequently, a first window is opened through a first portion of the first protective layer by conventional photolithographic masking and etching techniques to expose a first portion of the substrate and circumferentially define a second portion of the first protective layer and a second central unexposed portion of the substrate therebeneath. The first window is opened by successively employing an etch, such as a reactive ion etch, to remove the previously deposited material of the first protective layer which may, for instance, comprise oxides, nitrides and polysilicons. A first doping is made through the first window to establish a first region employing a light concentration of a fast diffusing one type conductivity material to produce a first lightly doped region of one type conductivity within the first region. Subsequently, a second doping is performed through the first window to establish a second region of opposite type conductivity. In a preferred embodiment, the second region can be established by a heavy concentration of slow diffusion opposite type conductivity material in combination with conventional implantation and diffusion doping techniques. Thereafter, a second protective layer which is different from the exposed material of the first protective layer, is disposed in the first window and can, for instance, comprise an oxide layer. The portion of the first protective layer lying outside the first portion of the first protective layer can be coated with an etch resistant material, such as photoresist, by employing a loose fitting mask which overlaps onto the second protective layer but not onto the second portion of the first protective layer. A second window is opened through the second portion of the first protective layer to thereby expose the unexposed second central portion of the substrate. A third doping of the substrate is performed through the second window with a heavy concentration of a fast diffusing one type conductivity material to establish a second one type conductivity base region.

The present invention thus provides for an improved method of fabricating self aligned semiconductor devices. In particular, the improved method of fabricating semiconductor devices of the present invention can be employed to fabricate any of a variety of insulated gate semiconductor devices such as insulated gate transistors, MOS controlled thyristors and MOSFETs. The improved method of fabrication allows devices to be produced in which the various device regions are precisely aligned to thereby eliminate the need for establishing tolerance zones within device regions and the need to make regions of a larger size than would otherwise be necessary to afford a tolerance for misalignment between successive masks. The present invention allows devices to be fabricated with close tolerance limits. Moreover, the method of fabricating the insulated gate semiconductor of the present invention allows for the full utilization of available semiconductor real estate and thus enables the performance of devices established in various chips to be maximized.

BRIEF DESCRIPTION OF THE DRAWINGS

The features of the present invention which are believed to be novel are specified with particularity in the appended claims. The invention itself, however, both as to organization and method of operation together with additional features, objects and advantages of the improved method of fabricating self aligned insulated gate semiconductor devices can be best understood by reference to the following detailed description when taken in conjunction with the accompanying drawings in which:

DETAILED DESCRIPTION OF THE PREFERRED EMBODIMENTS

Figure 1A:
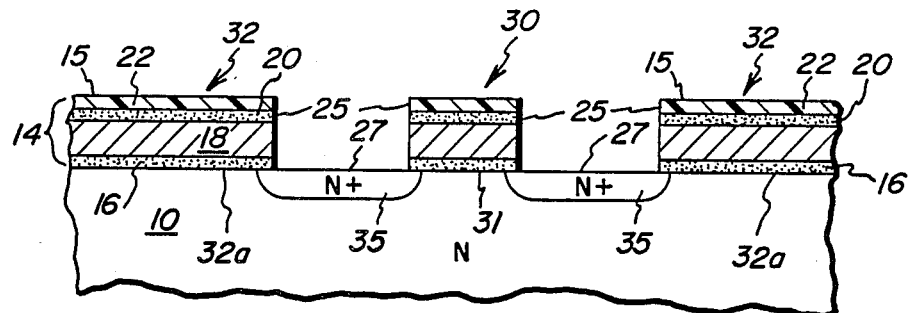
FIGS. 1a-1f are illustrations of successive steps in a first preferred embodiment of a process of fabricating a self aligned insulated gate semiconductor device in accordance with the present invention.

The improved method of fabricating the self aligned insulated gate semiconductor device of the present invention is applicable to a broad range of semiconductor devices which can be fabricated from a variety of semiconductor materials. The ensuing description will disclose several preferred embodiments of the improved method of fabricating self aligned semiconductor devices of the present invention as implemented in a silicon substrate because silicon devices, or devices fabricated in silicon substrates, make up an overwhelming majority of the currently available semiconductor devices. Consequently, the most commonly encountered applications of the present invention will involve silicon substrates. Nevertheless, it is intended that the invention disclosed herein can be employed in other semiconductor materials such as germanium or gallium arsenide and the method of the present invention is equally applicable to these other semiconductor technologies. Accordingly, application of the present invention should not be limited to devices fabricated in silicon substrates and the disclosed techniques, but instead, encompass those devices fabricated in any of a number of semiconductor materials and by equivalent techniques.

Moreover, while the present description discusses a number of preferred embodiments directed to three region insulated gate semiconductor devices, it is intended that these disclosures be considered as illustrative examples of the preferred embodiments of the present invention and not as limitations on the scope or applicability of the present invention. Moreover, while the illustrated examples discuss the improved method of fabricating a self aligned insulated gate semiconductor device in combination with an insulated gate transistor or IGT, it is recognized that the present invention has applicability to other insulated gate semiconductor devices including but not limited to metal oxide semiconductor field effect transistors (MOSFETs) and MOS controlled thyristors (MCTs). Further, while the present invention provides for precise alignment of various device regions to, for instance, increase the latching threshold of a particular device, it is also recognized that the method of the present invention provides for other benefits attendant the precise alignment of device regions including reduced cell size and reduced cell repeat distance, which also can result in improved cell density and improved current density.

Given the corresponding relationship of the devices illustrated in FIGS. 1-4, corresponding regions, layers and parts have been designated with the same reference numeral as an aid to understanding the description of the present invention. Various portions of the semiconductor elements, however, have not been drawn to scale. Certain dimensions have been exaggerated in relation to other dimensions in order to present a clearer illustration and understanding of the invention. Although for the purposes of illustration the preferred embodiment of the improved method of fabricating a self aligned insulated gate semiconductor device in accordance with the present invention has been shown in each particular embodiment to include specific P and N type regions, it is understood by those skilled in the art that the teachings herein are equally applicable to insulated gate semiconductor devices in which the conductivities of the various regions have been reversed to, for instance, provide the dual of the device. Further, although the embodiments illustrated herein are shown in two dimensional vertical cross-sectional views, it understood that these regions are illustrations of only a portion of a single cell of a device which is comprised of a plurality of cells arranged in a three dimensional structure. Accordingly, these regions, when fabricated in actual devices, will comprise a plurality of regions having three dimensions comprising length, width and depth and which can be established by rotating the illustrated two dimensional device about a vertical axis through the center of the second portion 30 of the first protective layer 14 discussed below.

Referring now to FIG. 1, a preferred embodiment of the method of fabricating a self aligned semiconductor device in accordance with the present invention is illustrated in successive steps in FIGS. 1a-1g. Initially, a first semiconductor layer or substrate 10 which comprises a silicon wafer having a thickness of approximate 20 mils, a resistivity of approximately 5 ohms/cm and doping to a concentration of approximately $10^{15}$ carriers/cc with opposite type conductivity carriers which are illustrated to be N-type conductivity carriers is provided. The substrate 10 can alternatively be a partially processed semiconductor wafer comprising a plurality of layers of one or the opposite type conductivities. A first protective layer 14 is provided atop the substrate 10, as shown in FIG. 1a. In one embodiment, the first protective layer 14 can comprise a first insulating layer 16 which can, for instance, comprise a native oxide, a gate electrode layer 18, such as polysilicon, disposed atop the first insulating layer 16, and a second insulating layer 20 enclosing the gate electrode 18 within an envelope comprising the first and second insulating layers 16 and 20. The second insulating layer 20 can be a native oxide of the polysilicon gate material. A nitride layer 22 can also be provided atop the second insulating layer 20. A first window 25 which can, for instance, be annular or ring shaped, is opened through a first portion of the first protective layer 14, which has been removed to expose a first portion 27 of the surface of the substrate 10 and to circumferentially define or encompass a second central portion 30 of the first protective layer 14 and an unexposed portion 31 of the surface of the substrate 10 therebeneath. The first window 25 also defines a third portion 32 of the first protective layer 14 and a third portion 32a of the surface of the substrate 10 therebeneath lying outside the first window 25. The first window 25 thus divides the first protective layer 14 and the substrate 10 therebeneath into three separate zones or surface portions.

Photolithographic techniques can be used in combination with imaging materials such as external masks to photolithographically define a mask on the upper surface 15 of the first protective layer 14 which can be developed to define the portion of the first layer 14 through which the first window 25 will be opened. Subsequently, an etch such as a reactive ion etch can be used to successively etch through the nitride, oxide, polysilicon and oxide layers 22, 20, 18 and 16, respectively, which comprise the first protective layer 14. This results in the structure shown in FIG. 1a.

Once the first window 25 has been opened and a first portion 27 of the substrate 10 has been exposed, a first doping can be made into the substrate 10 through the first window 25 to form a first region 35. In the fabrication of a MOSFET device, a slow diffusing heavy concentration of an opposite type conductivity material such as arsenic is preferably used in combination with conventional implantation or diffusion techniques to establish the first heavily doped opposite type conductivity region 35, shown as an N type conductivity region.

Figure 1B:
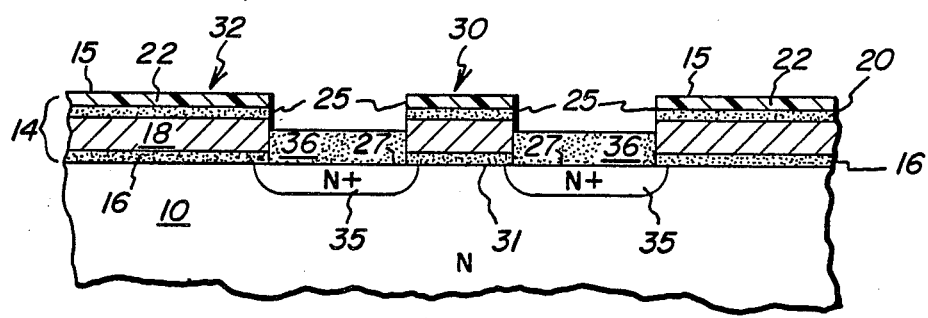

Subsequently, and as shown in FIG. 1b, a second protective layer 36 is established in the first window 25 atop the first region 35 on the exposed first surface portion 27 of the semiconductor substrate 10. The second protective layer 36 can, for instance, be a native oxide such as silicon dioxide in the case of a silicon substrate. It is particularly preferred that the material of the second protective layer 36 be different from the materials of the first protective layer 14 or at least the material comprising the exposed surfaces thereof. In the illustrated example, the upper surface 15 comprises a nitride layer 22. This criteria must be satisfied to allow the material of either the first or second protective layers 14 and 36 respectively, to be removed without removing the other. The first protective layer 14 can thus be said to be differentially etchable with respect to the second layer 36 or vice versa.

Figure 1C:
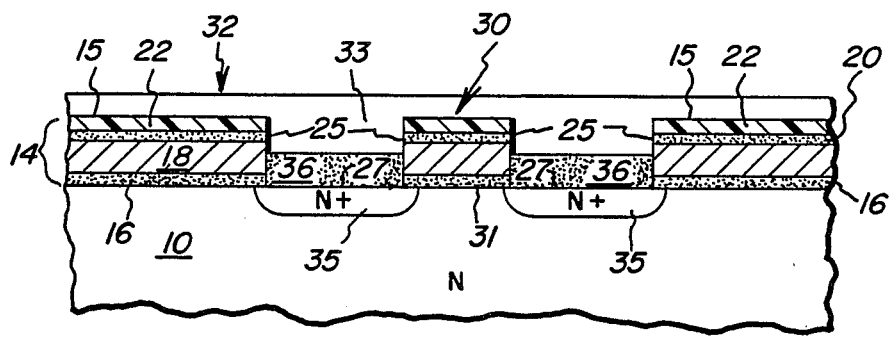
Figure 1D:
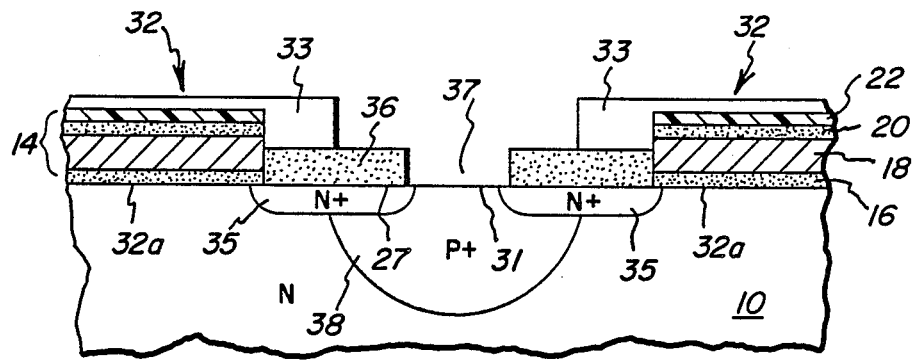

Referring now to FIG. 1c, to open a second window without removing the third portion 32 of the first protective layer 14 existing outside with first window 25, a photoresist layer 33 can be deposited on the surface of the device covering the first and second protective layers. Thereafter, a second loose fitting mask (not shown) can be used to remove the portion of the photoresist layer 33 overlying the second central portion 30 of the first protective layer 14 and a portion of the second protective layer Subsequently, and referring now to FIG. 1d, a second window 37 is opened through the second portion 30 of the first protective layer 14 to expose the previously unexposed second portion 31 of said substrate 10 by, for instance, using selective etches which react with and remove the material of the first protective layer 14, but do not remove all the material of the second protective layer 36. In the illustrated example, the second protective layer 36 comprises silicon dioxide, while the first protective layer 14 comprises a silicon nitride layer 22 atop an oxide layer 20 which is atop a polysilicon gate layer 18 which is atop a silicon oxide layer 16. The second portion 30 of the first insulating layer 14 can then be removed by employing a reactive ion type etches to open a second window 37 by removing only the second portion 30 of the first protective layer 14.

Subsequently, a second doping is performed through the second window 37 into the second portion 31 of the substrate 10 surface to establish a second region 38 of one type conductivity, illustrated as a P+ region. In a preferred embodiment, the second doping is achieved by employing a heavy concentration of a fast diffusing one type conductivity material, such as boron, in combination with conventional implantation or diffusion techniques.

Figure 1E:
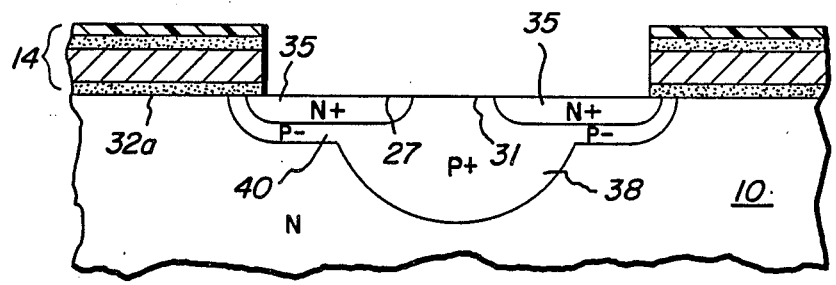

Thereafter, and as illustrated in FIG. 1e, the photoresist layer 33 is stripped and the second protective layer 36 can be removed by, for instance, a buffered hydrofluoric acid etch techniques to expose the first and second portions 27 and 31 respectively, of the surface of substrate 10, and the first and second regions 35 and 38 respectively established therein. A third doping can then be performed with a light concentration of fast diffusing one type conductivity dopant such as boron to establish a third one type conductivity region 40. A contact electrode 60 as shown in FIG. 1f can be conventionally deposited in ohmic contact with the first and second regions 35 and 38 of the device to short the junction between the second and first regions and to inhibit that junction from being forward biased.

Figure 1F:
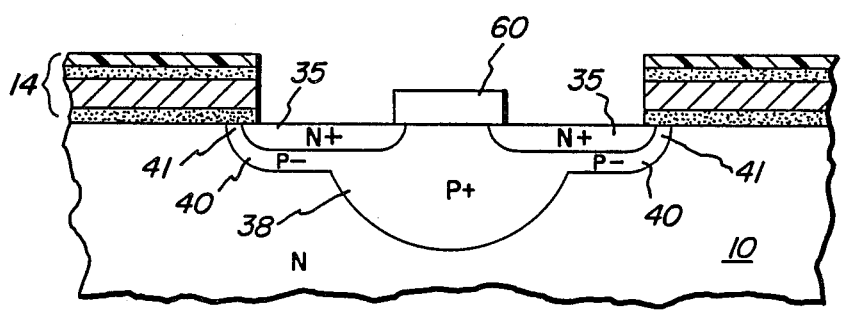

In the insulated gate embodiment of the present invention illustrated in FIG. 1f, the lightly doped third region 40 is established such that a portion 41 of the third region 40 extends beneath the first protective layer 14. The portion 41 of the third region which extends beneath the first protective layer 14 can be referred as the channel portion 41 inasmuch as the gate electrode 18, in response to an appropriately applied bias potential, establishes a channel within the channel portion 41 of the third region 40 to facilitate the flow of opposite type conductivity carriers between the first region 35 and the substrate 10. The channel region 41 can be formed beneath the first protective layer 14 by doping the second region 38 with a material which diffuses laterally beneath the first protective layer 14 as well as vertically downward into the substrate 10. It is preferred that the first protective layer 14 overlap, and be contiguous with, the channel region 41. Further, it is preferred that the first protective layer 14 overlap the entire perimeter of the channel region 41.

It is also preferred that the first window 25 and first, second and third device regions be circular in horizontal cross section.

It is to be recognized that by virtue of the process of self aligned fabrication of an insulated gate semiconductor device in accordance with the present invention, the first source region 35 has been disposed in a precise and predefined relationship with respect to the second and third regions 38 and 40 respectively, which are also hereinafter respectively referred to as the base region 38 and the base appendage region 40, respectively. The first region 35 in combination with the substrate 10, defines a channel region 41 in the third region 40 disposed beneath the first protective layer 14, which has been formed as an insulated gate electrode. The separation between the first region 35 and the substrate 10, or alternatively the width of the third region 40 proximate the substrate surface, defines the channel length. Accordingly, precise alignment between the first, second and third regions 35, 38 and 40 respectively, is desirable.

In addition, the heavily doped second region 38 has been provided to minimize the voltage drop along the PN junction between the first region 35 and second and third regions 38 and 40 respectively, to minimize the possibility that a voltage drop of greater than 0.7 volts can be developed along the junction by one type carriers flowing in the second and third regions 38 and 40 respectively, to a shorting electrode 60. A voltage drop in excess of approximately 0.7 volts occurring along this junction would activate the inherent and parasitic NPN transistor formed by the first region 35, the second/third regions 38/40 and the substrate 10. Undesired activation of this parasitic transistor has been made less likely by establishing the various device areas in precise relation to each other. This precise alignment has been made possible through the use of a single annular or doughnut shaped mask established atop the first protective layer 14 by photolithographic techniques. The relative size, depth and relationship of the first, second and third regions 35, 38 and 40, respectively, however, is dependent not only on the configuration of the mask, but also of the selection of appropriate doping materials and the process conditions under which those doping materials are applied. Many of the fabrication parameters change depending on the type and conductivity of device one wishes to establish. The effect of the various process parameters on establishing various device regions are discussed in much of the current literature and well known texts including, for instance, "The Physics and Technology of Semiconductor Devices" by A. S. Grove, John Wiley & Son, 1967 and "Quick Reference Manual for Silicon Integrated Circuit Technology", Beadle et al., John Wiley & Sons, 1985. However, in a preferred embodiment of the present invention, the following approximate process parameters can be employed.

| Device Region | Parameter |
| --- | --- |
| First oxide layer 16 (thickness) | 1,000 angstroms |
| Gate electrode 18 (thickness) | 1 micron |
| Second insulation 20 | 4,000 angstroms |
| Nitride layer | 1,000 angstroms |
| First region | $10^{17}$ atoms/cm$^3$ dopant |
| Second region | $10^{17}$ atoms/cm$^3$ dopant |
| Third region | $10^{15}$ atoms/cm$^3$ dopant |
| Second protective layer | 4,000 angstroms |

Referring now to FIGS. 2a–2f, an alternate preferred embodiment of the self-aligned method of forming a insulated gate semiconductor device in accordance with the present invention is shown. In this alternate embodiment, the first window 25 is initially opened through a first portion of the first protective layer 14 to circumferentially define or encompass a second portion 30 of the protective layer 14 and a central unexposed portion 31 of the surface of the substrate 10 surface therebeneath. The first window also defines a third portion 32 of the first protective layer residing outside the first window 25. A second protective layer 36, is initially established in the first window 25. The second portion 30 of the protective layer 14 is removed so that the deep P+ base region 38 may be established, with the P— base appendage region 40 being subsequently established, and lastly, the first N+ source region 35 is established. Accordingly, this alternate preferred method of the self aligned fabrication of an insulated semiconductor device has reordered the steps in which the base and source regions of the device are established, from those steps previously described in conjunction with FIGS. 1a–1f.

Figure 2A:
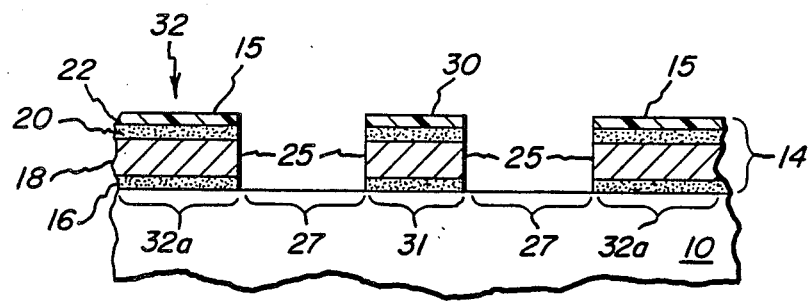
FIGS. 2a-2g are illustrations of successive steps in a second preferred embodiment of a process of fabricating a self aligned insulated gate semiconductor device in accordance with the present invention.

More particularly, this alternate preferred method of self aligned fabrication of semiconductor devices as illustrated in FIG. 2a comprises the steps of providing a semiconductor substrate 10 and coating a surface of the substrate with a first protective layer 14. A first window 25 is opened through the first protective layer 14 to expose a first portion 27 of the surface of the substrate 10 and to circumferentially define a second portion 30 of the first protective layer 14. The first window 25 also defines a third portion 32 of the first protective layer 14 lying outside the first window.

Figure 2B:
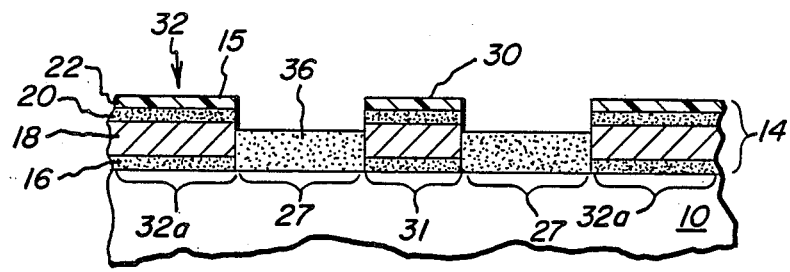
Figure 2C:
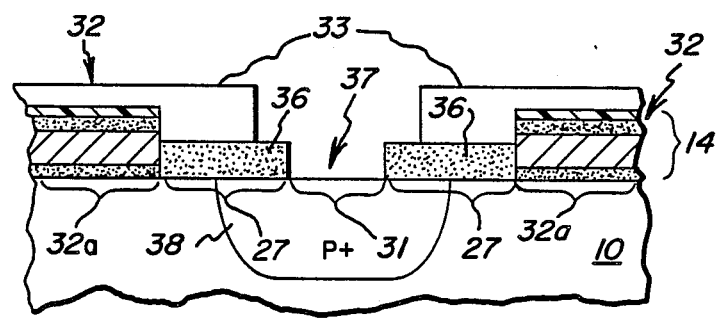
Figure 2D:
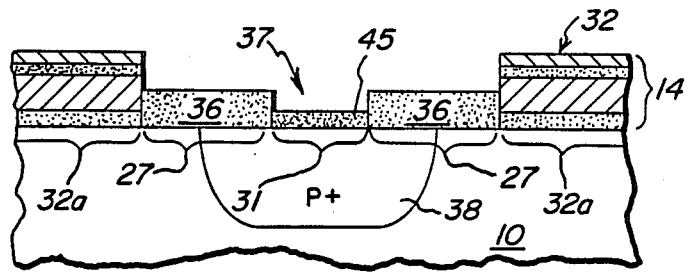

Subsequently, as shown in FIG. 2b, a second protective layer 36 of a material which is differentially etchable with respect to the material of the first protective layer 14 such as a native oxide is provided within the first window 25. A photoresist layer 33 can then be disposed over the third portion 32 of the first protective layer 14 and a portion of the second protective layer 36 by employing a loose fitting mask. A differential etch is then used to open a second window 37 as shown in FIG. 2c, through the entire second portion 30 of the first protective layer 14 to expose the second portion 31 of the surface of the substrate 10. A first doping is made with one type conductivity carriers into the substrate 10 to establish the base region 38 illustrated as a deep P+ region. Subsequently, as shown in FIG. 2d, a third protective layer 45 is established in the second window 37 by, for instance, growing a native nitride such as silicon nitride Si$_3$N$_4$ therein.

Figure 2E:
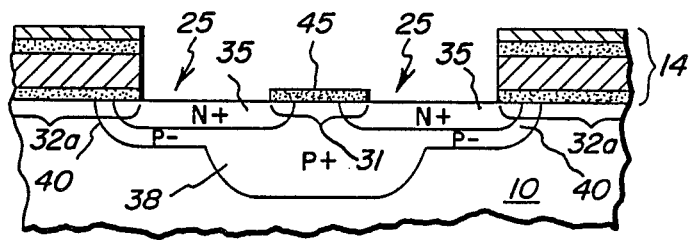

Thereafter, a third window shown in FIG. 2e is opened through the region of the first window 25 by, for instance, removing with an appropriate differential etch, the previously provided second protective layer 36 to expose the first portion 27 of the surface of the substrate 10 including surface portions of the base region 38 and undoped substrate 10. Subsequently, a second doping is made through the third window to establish a lightly doped base appendage region 40 of one type conductivity illustrated in FIG. 2e as a lightly doped P— base extension. Thereafter, a third doping can be made with an opposite type conductivity material through the same third window, to establish the source region 35 which is shown as a heavily doped N+ type conductivity region.

Figure 2F:
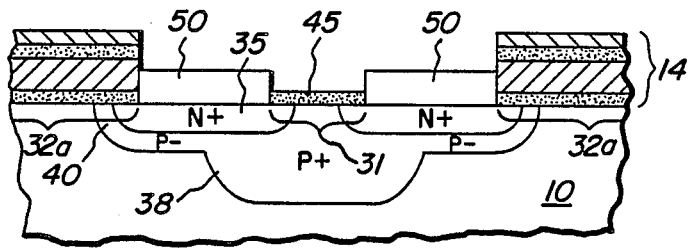

A fourth protective layer 50 which is shown in FIG. 2f advantageously comprises a native oxide such as silicon dioxide can be grown in the third window.

Figure 2G:
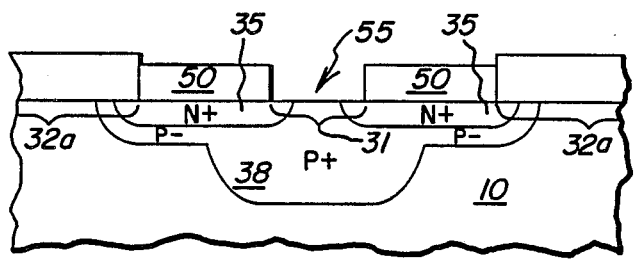

Subsequently, a fourth window 55 can be opened through the third protective layer 45 disposed within the second window 37 by, for instance, employing a differential etch to remove the third protective layer 45 to expose a portion of the base and source regions 38 and 35, respectively, as shown in FIG. 2g. In a preferred embodiment, a metallization layer (not shown) is applied within the fourth window 55 to short the source region 35 to the base region 38/40 of the device, thereby reducing the likelihood that the parasitic transistor will turn on and cause the device to operate in other than a preferred manner.

In an alternate preferred embodiment of the process illustrated in FIG. 2, the base diffusion is performed as shown in FIG. 2c to establish the P+ base region 38, finishing with an especially heavy surface concentration. The third protective layer 45 of FIG. 2d is not provided. Instead, the second protective layer 36 is removed to expose the first and second portions 27 and 31 of the substrate 10 surface. A first doping is performed with a light concentration of a fast diffusing one type conductivity material, such as boron, to establish the base appendage region 40. Another doping is performed with a heavy concentration of slow diffusing opposite type conductivity material to establish the N+ source regions 35. The N+ source region doping is preferably performed by implantation to establish a low opposite conductivity surface concentration to avoid unduly diminishing the ohmic connection capability of the central P+ region 38. The structure of FIG. 2g would result with the exception of the fourth protective layer 50 which need not be provided.

As discussed previously, the parameters of the various doping concentrations and temperature levels involved in the processing of devices is closely related to the type of device which one wishes to ultimately achieve, and it is therefore difficult to specify a single embodiment or range of devices which constitute a preferred embodiment of the present invention. However, it is recognized that satisfactory insulated gate semiconductor devices can be fabricated by employing the following approximate parameters in the fabrication of these devices:

| Device | Parameter |
| --- | --- |
| First oxide layer 16 | 1,000 angstroms |
| Gate electrode 18 | 1 micron |
| Second insulation 20 | 4,000 angstroms |
| Nitride layer 22 | 1,000 angstroms |
| First region | $10^{17}$ atoms/cc dopant |
| Second region | $10^{15}$ atoms/cc dopant |
| Third region | $10^{17}$ atoms/cc dopant |
| Second protective layer | 4,000 angstroms |
| Third protective layer | 1,000 angstroms |

Referring now to FIG. 3, an alternate preferred embodiment of the present invention is illustrated to include an alternate process in which a first window 25 is established where a first portion of a first protective layer 14 stood, to expose a first portion 27 of the surface of the semiconductor substrate 10 and circumferentially define a second portion 30 of the protective layer 14 and an unexposed portion 31 of the substrate 10 surface therebeneath. Initially, the lightly doped base region appendages 40 are established with the heavily doped deep base region 38 being subsequently established, and finally, the heavily doped source region 35 is established.

In this alternate preferred method of fabricating an insulated gate semiconductor device in accordance with the present invention, a semiconductor substrate 10 is provided having a resistivity of approximately 5 ohms-cm. A first protective layer 14, such as a nitride layer, is established atop the substrate 10 and a first window 25 is opened through a first portion of the first protective layer 14 to expose a first portion 27 of the substrate 10 surface and to circumferentially define a second portion 30 of the first protective layer 14 and a second central unexposed portion 31 of the surface of substrate 10. The first window 25 also defines a third portion 32 of the first protective layer 14 lying outside the first window 25. A first doping is made through the first window 25 by, for instance, employing a light concentration of a fast diffusing one type conductivity material, such as boron, to establish the base appendage region 40 of one type conductivity. It is preferred that base appendage region 40 extend beneath the first protective layer 14 to establish a channel region of the device. Subsequently, a second protective layer 36, such as a differentially etchable native oxide layer, is established within the first window 25 and can, for instance, be grown during the drive in of the base region 40.

Figure 3A:
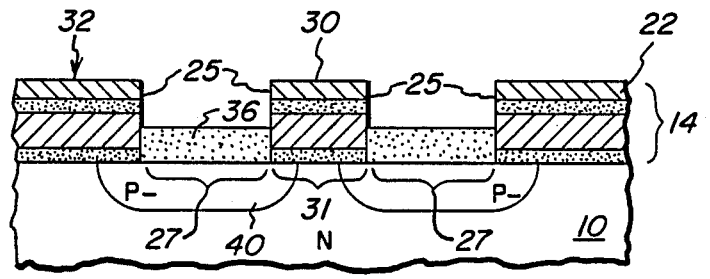
FIGS. 3a-3e are illustrations of successive steps in a third preferred embodiment of a process of fabricating a self aligned insulated gate semiconductor device in accordance with the present invention.
Figure 3B:
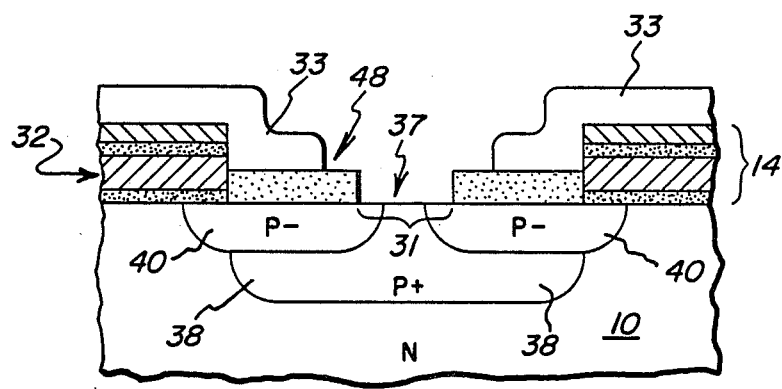

Thereafter, as shown in FIG. 3b, a photoresist mask layer 33 previously discussed can be established over the third portion 32 of the first protective layer 14 and a portion of the second protective layer 36 to allow the second portion 30 of the first protective layer 14 to be removed without removing the third portion 32. Subsequently, differential etching techniques are employed to open a second window 37 through the entire second portion 30 of the first protective layer 14 to expose the circumferentially defined central unexposed second portion 31 of the surface of the substrate 10. A second doping is made through the second window 37 to establish a base region 38 by, for instance, employing conventional implantation or diffusion techniques using a heavy concentration of a fast diffusing one type conductivity material such as boron. The photoresist layer can be removed if not previously removed.

Figure 3C:
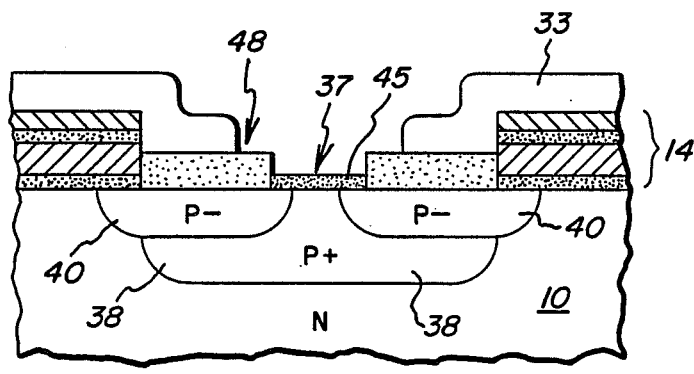

Subsequently, a third protective layer 45, shown in FIG. 3c, which advantageously can be a differentially etchable nitride layer, is disposed in the area of the second window 37.

Figure 3D:
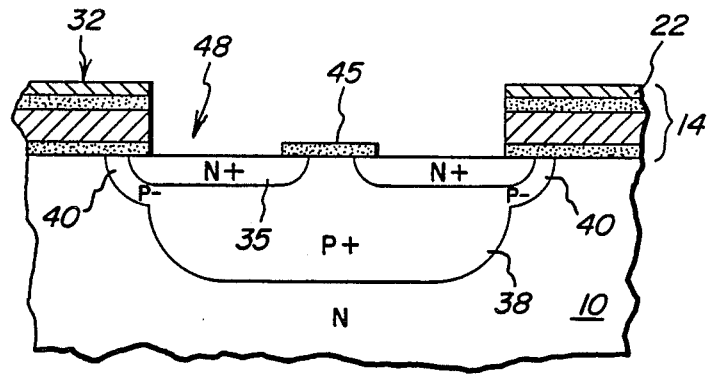
Figure 3E:
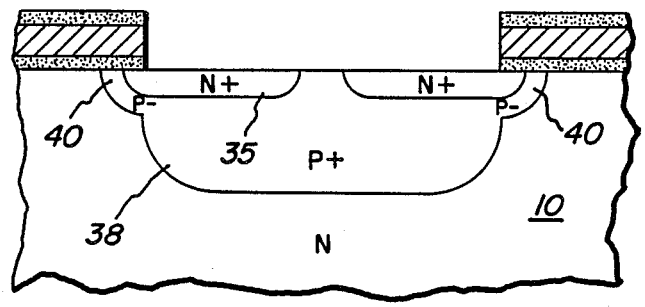

Thereafter and referring to FIG. 3d, a third window 48 is opened through the area of the first window 25 by, for instance, removing the second protective layer 36 with an appropriate etch such as a buffered hydrofluoric acid etch to re-expose a portion of the first portion 27 of the surface of the substrate 10. The third window 48 encompasses the third protective layer 45. Subsequently, as shown in FIG. 3d, a heavy concentration of an opposite type conductivity dopant, such as phosphorus, is introduced through the third window 48 to establish the source region 35 as a heavily doped opposite type conductivity region which is illustrated as an N+ region disposed in self aligned precision within the lightly doped P base appendage region 40 and the heavily doped P type base region 38. The third protective layer 45 is then removed with an appropriate etchant, leaving the structure illustrated in FIG. 3e.

It has been found that a satisfactory insulated gate semiconductor device fabricated in accordance with the method of self aligned fabrication of the present invention can be achieved by employing the following approximate process parameters:

| Device | Parameter |
| --- | --- |
| First oxide layer 16 | 1,000 angstroms |
| Gate electrode 18 | 1 micron |
| Cover insulation 20 | 4,000 angstroms |
| Nitride layer 22 | 1,000 angstroms |
| First region | $10^{15}$ atoms/cc dopant |
| Second region | $10^{17}$ atoms/cc dopant |
| Third region | $10^{17}$ atoms/cc dopant |
| Second protective layer | 4,000 angstroms |
| Third protective layer | 1,000 angstroms |

Figure 4A:
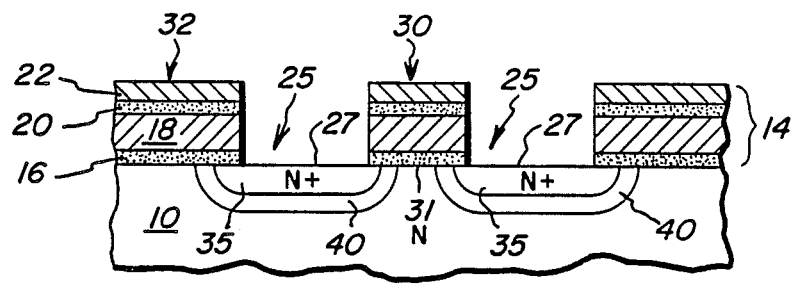
FIGS. 4a-4c are illustrations of successive steps of a still further alternate preferred embodiment of fabricating a self aligned insulated gate semiconductor device in accordance with the present invention.
Figure 4B:
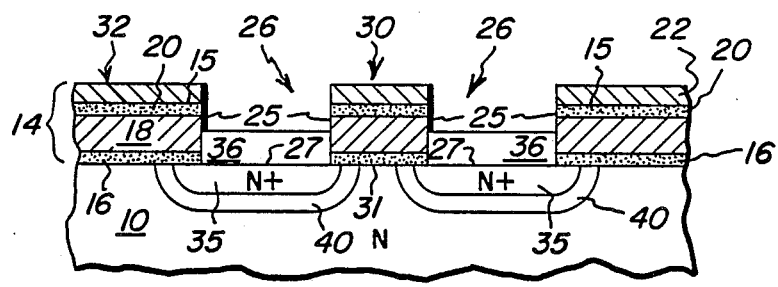
Figure 4C:
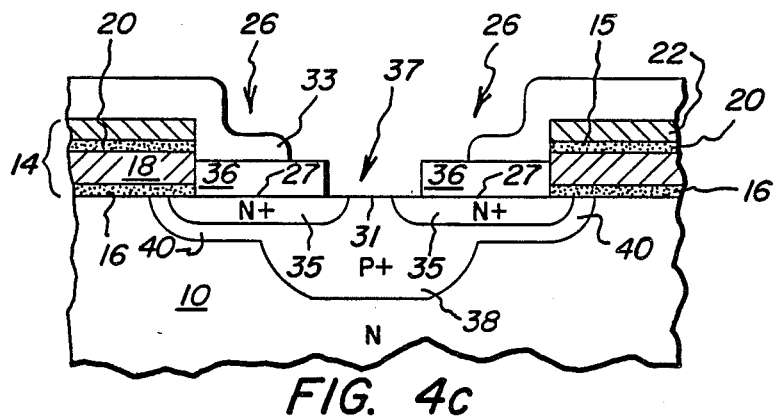

A still further preferred embodiment of the method of fabricating a self aligned semiconductor device in accordance with the present invention is illustrated in successive steps in FIGS. 4a–4c. Initially, a semiconductor substrate 10 which can comprise a silicon wafer having a thickness of 20 mils and a resistivity of approximately 5 ohms/cm, and being doped to a concentration of approximately $10^{15}$ carriers/cc with opposite type conductivity carriers, which are illustrated to be N type conductivity carriers is provided as shown in FIG. 4a. A first protective layer 14 such as a nitride layer is provided atop the substrate 10. In a preferred embodiment of an insulated gate semiconductor device of the present invention, the first protective layer 14 can comprise a first insulating layer 16 which can, for instance, be a native oxide, a gate electrode 18, such as polysilicon is disposed atop the first insulating layer 16 and a second insulating layer 20 atop gate electrode 18. The second insulating layer can be a native oxide of the polysilicon gate material. A passivating layer, such as a nitride layer 22 is disposed atop the second insulating layer 20.

A first window 25 is opened through a first portion of the first protective layer 14 which has been removed to expose a first surface portion 27 of the substrate 10 and to circumferentially define a second central portion 30 of the first protective layer 14 and an unexposed surface portion 31 of substrate 10 therebeneath. As illustrated, the unexposed surface portion 31 of the substrate 10 is covered with the second portion 30 of first protective layer 14.

Once the first window 25 has been opened, a first portion of the substrate 10 has been exposed, a first doping can be made into the substrate 10 through the first window 25 to form a base appendage region 40. In a preferred the fabrication of a MOSFET device, a fast diffusing light concentration of one type conductivity material, such as boron, can be used in combination with conventional implantation or diffusion techniques to establish the first lightly doped one type conductivity region 40 shown as a P type conductivity region. It is preferred that the base appendage region 40 extend beneath the first protective layer 14 to establish the channel region of the device. Subsequently, a second doping is performed through the same first window 25 into the first surface portion 27 of the substrate 10 with, for instance, a slow diffusing opposite type conductivity dopant, such as arsenic, to establish a heavily doped source region 35 of opposite type conductivity shown as an N type region.

Referring now to FIG. 4b, a second protective layer 36 is next established in the first window 25 atop the first region 35 on the exposed surface of the first portion 27 of the semiconductor substrate 10. In a preferred embodiment, the second protective layer 36 is differentially etchable and can comprise, for instance, a native oxide such as silicon dioxide in the case of a silicon substrate.

Subsequently, and referring now to FIG. 4c, a photoresist layer 33 is established over the third portion 32 of the first protective layer 14 and a portion of the second protective layer 36 by using a loose fitting mask. Thereafter and by using a differential etch, a second window 37 is opened through the entire second portion 30 of the first protective layer 14 to also expose the previously unexposed second portion 31 of the surface of the substrate 10 by, for instance, using selective etches which are reactive with the material of the first protective layer 14 and which are not reactive with the material of the second protective layer 36. The second portion 30 of the first insulating layer 14 can be removed by employing a reactive ion type etch to open a second window 37.

Subsequently, a third doping is performed through the second window 37 into the second surface portion 31 of the substrate 10 to establish a base region 38 of one type conductivity, illustrated as a P+ region within the substrate 10. The second doping is preferably achieved by employing a heavy concentration of a fast diffusing one type conductivity material, such as boron, in combination with conventional implantation or diffusion techniques. Thereafter, conventional metallization and patterning steps can be performed to complete the device.

It is to be recognized that while the preferred embodiments of the present invention have been disclosed with respect to the self aligned method of fabricating an insulated gate semiconductor device, such as an insulated gate transistor, it is to be recognized that the self aligned techniques of the present invention can be employed to establish any of a number of semiconductor devices. Further, it is to be recognized that the method of self aligned fabrication of the present invention contributes significantly to an improved semiconductor device by providing for precisely aligned regions which require less tolerance between regions and thus maximize the use of available chip substrate area to improve cell density and reduce cell size and cell repeat distance.

While the preferred embodiments of the present invention have been illustrated and described, it is clear that the invention is not so limited. Numerous modifications and changes, variations and substitutions and equivalents will occur to those in the art without departing from the true spirit and scope of the present invention. Accordingly, it is intended that the invention herein be limited only by the scope of the appended claims.

What is claimed is:

1. A method of fabricating a self aligned semiconductor device comprising the steps of:
    (a) providing a semiconductor substrate having a major surface;
    (b) providing a first protective layer atop said substrate surface;
    (c) opening a first window through a first portion of said protective layer, said first window having an inner perimeter and an outer perimeter and encompassing a second portion of said first protective layer
    (d) introducing a first dopant into said substrate through said first window to establish a first doped region, said first doped region being self aligned with respect to said first window;
    (e) forming a second protective layer over said substrate in said first window;
    (f) opening a second window by removing said second portion of said first protective layer;
    (g) introducing a second dopant into said substrate through said second window to establish a second doped region, said second doped region being self aligned with respect to said inner perimeter of said first window;
    (h) opening a third window through said second protective layer to expose a portion of said first doped region; and
    (i) introducing a third dopant through said third window into said first region to establish a third region, said third doped region being self aligned with respect to the outer perimeter of said first window.

2. The method of fabricating a semiconductor device of claim 1 wherein said second and third regions are of one opposite type conductivity and said substrate and said first region are of opposite type conductivity.

3. The method of fabricating a semiconductor device of claim 1 wherein said first, second and third protective layers are substantially impermeable to diffusion dopant penetration.

4. The method of fabricating a semiconductor device of claim 1 wherein said first, second and third protective layers are substantially impermeable implantation dopant penetration.

5. The method of fabricating a semiconductor device of claim 1 wherein said third region extends beyond said outer perimeter of said first window beneath said first protective layer.

6. The method of fabricating a semiconductor device of claim 1 further comprising the step of providing a metallization layer in ohmic contact with a portion of said first and second regions.

7. The method of fabricating a semiconductor device of claim 1 wherein said first protective layer comprises an insulated gate electrode.

8. The method of fabricating a semiconductor device of claim 1 wherein said first protective layer comprises an a first insulating layer disposed atop said substrate, a gate electrode disposed atop said first insulating layer and a second insulating layer disposed atop said gate electrode.

9. The method of fabricating a semiconductor device of claim 8 wherein said first insulating layer comprises a native oxide of the semiconductor material of said substrate, said gate electrode comprises polysilicon and said second insulating layer comprises a native nitride of said polysilicon gate electrode.

10. The method of fabricating a semiconductor device of claim 1 wherein said step of opening said second window comprises:
    providing a photoresist layer over a portion of said first protective layer beyond said outer perimeter of said first window, and over a portion of said second protective layer; and
    employing a reactive ion etch to remove said second portion of said first protective layer.

11. The method of fabricating a semiconductor device of claim 1 wherein the step of opening said first window comprises removing said first portion of said protective layer with reactive ion etch.

12. The method of fabricating a semiconductor device of claim 1 wherein the step of opening said first window comprises removing said first portion of said protective layer with buffered hydrofluoric etch.

13. The method of fabricating a semiconductor device of claim 1 wherein the step of opening said second window comprises removing said second portion of said first protective layer with a reactive ion etch.

14. The method of fabricating a semiconductor device of claim 1 wherein said first window is opened by photolithographically establishing a mask on the surface of said first protective layer to mask a portion of said first protective layer and subsequently employing an etchant to remove the unmasked region of the first protective layer.

15. A method of fabricating a self aligned semiconductor device comprising the steps of:
    (a) providing a semiconductor substrate having a major surface;
    (b) providing a first protective layer atop said substrate surface;
    (c) opening a first window through a first portion of said first protective layer, said first window having an inner perimeter and an outer perimeter and encompassing a second portion of said first protective layer;
    (d) closing said first window by providing a second protective layer in said first window;
    (e) opening a second window by removing said second portion of said first protective layer to expose the portion of said substrate surface thereunder;
    (f) introducing a first dopant into said substrate through said second window to establish a first doped region, said first doped region being self aligned with respect to said inner perimeter of said first window;
    (g) closing said second window by forming a third protective layer in said second window;
    (h) opening a third window by removing said second protective layer;
    (i) introducing a second dopant through said third window to establish a second doped region, said second doped region being self aligned with respect to said first window; and
    (j) introducing a third dopant through said third window to establish a third doped region, said third doped region being self aligned with respect to said first window.

16. The method of fabricating a semiconductor device of claim 15 further comprising the steps of:
    closing said third window by establishing a fourth protective layer in said third window;
    opening a fourth window by removing said third protective layer to expose a portion of said first and third doped regions; and
    applying a metallization layer in contact with said first and third regions for shorting said first and third regions.

17. The method of fabricating a semiconductor device in accordance with claim 16 wherein said first window is coextensive with said third window and said fourth window is coextensive with said second window, whereby the area of said first and third regions in contact with said metallization layer is self aligned with respect to said inner perimeter of said first window.

18. The method of fabricating a semiconductor device of claim 15 wherein said step of providing a first protective layer atop said substrate comprises the steps of:
    growing a first insulating layer on said major surface of said substrate;
    depositing a polysilicon layer atop said first insulating layer; and
    growing a nitride layer atop said polysilicon layer.

19. The method of fabricating a semiconductor device of claim 15 wherein said step of opening said first window is performed by photolithographically masking said first protective layer and subsequently etching the unmasked portion of said first protective layer.

20. The method of fabricating a semiconductor device of claim 19 wherein said first protective layer comprises a first insulating layer, a gate layer and a second insulating layer, and said step of opening said first window comprises employing a reactive ion etch to open said first window through said second insulating layer, said gate layer and said first insulating layer.

21. The method of fabricating a semiconductor device of claim 20 wherein said first insulating layer comprises a native oxide of the semiconductor material of said substrate.

22. The method of fabricating a semiconductor device of claim 20 wherein said second insulating layer comprises silicon nitride.

23. The method of fabricating a semiconductor device of claim 15 wherein said first protective layer comprises a first insulating layer, a gate electrode layer and a second insulating layer and said step of opening second window comprises the steps of:
  etching said second insulating layer to open a window therethrough;
  performing a second etch to open a window through said gate electrode layer; and
  performing a third etch to open a window through said first insulating layer.

24. The method of fabricating a semiconductor device in accordance with claim 15 wherein the step of introducing said first dopant is accomplished by diffusion.

25. The method of fabricating a semiconductor device in accordance with claim 15 wherein the step of introducing a first dopant is accomplished by implantation.

26. The method of fabricating a semiconductor device of claim 15 wherein said first and second doped regions are of one type conductivity and said substrate and said third doped region are of opposite type conductivity.

27. The method of fabricating a semiconductor device of claim 15 wherein second window is opened by providing a photoresist layer over a portion of said first protective layer lying beyond said outer perimeter of said first window and over at least a portion of said second protective layer and performing a reactive ion etch to remove said second portion of said first protective layer without removing said second protective layer.

28. The method of fabricating a semiconductor device in accordance with claim 15 wherein said first and second protective layers are differentially etchable.

29. The self aligned method of fabricating an semiconductor device of claim 15 wherein said first region is deeply diffused, said second region is less deeply diffused and said third region is shallowly diffused.

30. A self aligned method of fabricating a semiconductor device comprising the steps of:
  (a) providing a semiconductor substrate of opposite type conductivity, said substrate having a major surface;
  (b) providing a first protective layer atop said substrate surface;
  (c) opening a first window through said first protective layer, said first window having an inner perimeter and an outer perimeter and encompassing a second portion of said first protective layer;
  (d) introducing a one type conductivity dopant through said first window to establish a base appendage region, said base appendage region being self aligned with respect to said first window;
  (e) closing said first window by providing a second protective layer in said first window;
  (f) opening a second window by removing the portion of said substrate surface thereunder;
  (g) introducing a one type conductivity dopant through said second window to establish a central base region, said central base being self aligned with respect to said inner perimeter of said first window;
  (h) closing said second window by providing a third protective layer in said second window;
  (i) opening a third window by removing said second protective layer; and
  (j) introducing a dopant through said third window to establish a source region, said source region being self aligned with respect to said first window.

31. The self aligned method of fabricating a semiconductor device of claim 30 wherein said step of providing a first protective layer comprises the steps of:
  providing a first insulating layer;
  providing a polysilicon layer atop said first insulating layer;
  providing a second insulating layer atop said polysilicon layer; and
  providing a nitride layer atop said second insulating layer.

32. The self aligned method of fabricating a semiconductor device in accordance with claim 30 wherein said first window is established by photolithographically masking said first protective layer and etching said first protective layer to remove unmasked portions thereof.

33. The self aligned method of fabricating a semiconductor device in accordance with claim 30 wherein said second window is established by photolithographically masking a portion of said first protective layer lying beyond said outer perimeter of said first window and a portion of said second protective layer without masking said second portion of said first protective layer and etching unmasked portions of said first protective layer.

34. The self aligned method of fabricating a semiconductor device of claim 30 wherein said step of introducing a first dopant is performed by diffusion techniques.

35. The self aligned method of fabricating a semiconductor device in accordance with claim 30 wherein said step of introducing a first dopant is performed by implantation.

36. The self aligned method of fabricating a semiconductor device of claim 30 wherein said second protective layer comprises a native oxide of the semiconductor material of said substrate.

37. The self aligned method of fabricating a semiconductor device of claim 30 wherein said second protective layer comprises silicon dioxide.

38. The self aligned method of fabricating a semiconductor device of claim 30 wherein said third window is established by photolithographically masking said first and second protective layers and etching unmasked portions of said third protective layer.

39. The self aligned method of fabricating a semiconductor device of claim 38 further comprising the steps of:
  providing a fourth protective layer in said third window;
  removing the photolithographic mask and opening a window through said second protective layer.

40. The self aligned method of fabricating a semiconductor device of claim 30 wherein said third protective layer is resistant to oxide etch.

41. The self aligned method of fabricating a semiconductor device in accordance with claim 30 wherein said third region is of opposite type conductivity and said base appendage and central base regions are of one type conductivity.

42. The self aligned method of fabricating a semiconductor device of claim 30 wherein said central base region is doped to a depth greater than the depth of said base appendage region.

43. The self aligned method of fabricating an semiconductor device in accordance with claim 30 wherein said source region is shallow and heavily doped.

44. A method of fabricating a self aligned insulated gate semiconductor device comprising the steps of:
  (a) providing a semiconductor substrate having a major surface;

(b) providing a first protective layer atop said substrate surface;
(c) opening a first window through a first portion of said first protective layer, said first window having an inner perimeter and an outer perimeter and encompassing a second portion of said first protective layer;
(d) introducing a first dopant into said substrate through said first window to establish a first doped region, said first doped region being self aligned with respect to said first window;
(e) introducing a second dopant into said first region through said first window to establish a second doped region, said second doped region being self aligned with respect to said first window;
(f) closing said first window by disposing a second protective layer in said first window;
(g) opening a second window by removing said second portion of said first protective layer; and
(h) introducing a third dopant through said second window into said substrate to establish a third doped region, said third doped region being self aligned with respect to said inner perimeter of said first window.

45. The method of fabricating an insulated gate semiconductor device of claim 44 wherein said first and third regions are of one type conductivity and said substrate and second regions are of opposite type conductivity.

46. The method of fabricating a semiconductor device of claim 44 wherein said step of opening said second window comprises:
forming a photoresist layer over a portion of said first protective layer beyond said outer perimeter of said first window and a portion of said second protective layer; and
etching the portion of said first protective layer unprotected by said photoresist layer.

47. The method of fabricating a semiconductor device of claim 46 wherein said protective layers are substantially impermeable to implantation dopant penetration.

48. The method of fabricating a semiconductor device of claim 44 wherein said first region extends beneath said first protective layer outside of said outer perimeter of said first window.

49. The method of fabricating a semiconductor device of claim 44 further comprising the step of providing a metallization layer in ohmic contact with a portion of said first and second doped regions.

50. The method of fabricating a semiconductor device of claim 44 wherein said first protective layer comprises an insulated gate electrode.

51. The method of fabricating a semiconductor device of claim 44 wherein said first protective layer comprises a first insulating layer disposed atop said substrate, a gate electrode disposed atop said first insulating layer and a second insulating layer disposed atop said gate electrode.

52. The method of fabricating a semiconductor device of claim 51 wherein said first insulating layer comprises a native oxide of the semiconductor material of said substrate and said second insulating layer comprises a native nitride of the gate electrode material and said gate electrode comprises polysilicon.

53. The method of fabricating a semiconductor device of claim 44 wherein said first window is opened with an oxide specific etch.

54. The method of fabricating a semiconductor device of claim 44 wherein the step of forming a first window is performed with KOH etch.

55. The method of fabricating a semiconductor device of claim 1 wherein the step of forming a second window is performed with a reactive ion etch.

56. The method of fabricating a semiconductor device of claim 44 wherein the step of opening a first window comprises photolithographically establishing a mask on the surface of said first protective layer and subsequently etching away the unmasked region of the first protective layer.

57. A method of fabricating a self aligned semiconductor device comprising the steps of:
(a) providing a semiconductor substrate having a major surface;
(b) providing a protective layer atop said major surface;
(c) opening a window through a first portion of said protective layer, said window having an inner perimeter and an outer perimeter, encompassing a second portion of said protective layer and being encompassed by a third portion of said protective layer, said window thereby defining first, second, and third portions of said major surface, said first portion of said surface being that portion of said surface which is exposed within said window, said second portion of said surface being that portion which remains protected by said second portion of said protective layer and said third portion of said surface being that portion which remains protected by said third portion of said protective layer;
(d) forming a first doped region within said substrate beneath said first portion of said surface, said first doped region being self-aligned with respect to said window; and
(e) forming a second doped region within said substrate beneath said second portion of said surface, said second doped region being spaced from said third portion of said surface and self aligned with respect to said inner perimeter of said window.

58. The self aligned method of fabricating a semiconductor device of claim 57 wherein said first region extends beyond said outer perimeter of said window beneath part of said third portion of said protective layer.

59. A method of fabricating a self aligned semiconductor device comprising the steps of:
(a) providing a semiconductor substrate having a major surface;
(b) providing a protective layer atop said major surface;
(c) opening a window through a first portion of said protective layer, said window having an inner perimeter and an outer perimeter and encompassing a second portion of said protective layer, said window thereby defining first and second portions of said major surface, said first portion of said surface being that portion of said surface which is exposed within said window and said second portion of said surface being that portion which remains protected by said second portion of said protective layer;
(d) forming first and second doped regions within said substrate beneath said first portion of said surface, said first and second doped regions each being self aligned with respect to said window; and
(e) forming a third doped region within said substrate beneath said second portion of said surface, said third doped region being self aligned with respect to said inner perimeter of said window.

60. The method of fabricating a semiconductor device of claim 59 wherein said window divides said substrate into three separate regions, a first region underlying said window, a second region underlying said second portion of said protective layer and a third region lying beneath a portion of said protective layer beyond said outer perimeter of said window.

61. The method recited in claim 60 wherein said third doped region is spaced from said third region of said substrate.

* * * * *